US007297865B2

(12) United States Patent
Terao et al.

(10) Patent No.: US 7,297,865 B2
(45) Date of Patent: Nov. 20, 2007

(54) COMPACT MICRO-CONCENTRATOR FOR PHOTOVOLTAIC CELLS

(75) Inventors: Akira Terao, Cupertino, CA (US); Ralph Krippendorf, Stadtroda (DE)

(73) Assignee: Sunpower Corporation, San Jose, CA (US)

( * ) Notice: Subject to any disclaimer, the term of this patent is extended or adjusted under 35 U.S.C. 154(b) by 803 days.

(21) Appl. No.: 10/632,625

(22) Filed: Aug. 1, 2003

(65) Prior Publication Data

US 2005/0022858 A1  Feb. 3, 2005

(51) Int. Cl.
 *H01L 31/052* (2006.01)
(52) U.S. Cl. ..................... 136/246; 52/173.3
(58) Field of Classification Search .............. 52/173.3; 136/246
 See application file for complete search history.

(56) References Cited

U.S. PATENT DOCUMENTS 5,344,496 A * 9/1994 Stern et al. ............... 136/246
 2002/0080084 A1   6/2002 Strickland

OTHER PUBLICATIONS

Printout from www.dictionary.com for definition of "appendage", 2006.*
Mulligan et al., "Development of Chip-Size Silicon Solar Cells," Proceedings of the 28th IEEE Photovoltaic Specialists Conference, Anchorage, Alaska, 2000, pp. 158-163.
Mulligan et al., "A Flat-Plate Concentrator: Micro-Concentrator Design Overview," Proceedings of the 28th IEEE Photovoltaic Specialists Conference, Anchorage, Alaska, 2000, pp. 1495-1497.
Mulligan et al., "A Mirror-Less Design for Micro-Concentrator Modules," Proceedings of the 28th IEEE Photovoltaic Specialists Conference, Anchorage, Alaska, 2000, pp. 1416-1419.
Mulligan et al., "Degradation of Surface Quality Due to Anti-Reflective Coating Deposition on Silicon Solar Cells," Proceedings of the 28th IEEE Photovoltaic Specialists Conference, Anchorage, Alaska, 2000, pp. 295-298.
Terao et al., "New Developments on the Flat-Plate Micro-Concentrator Module," Proceedings of the 3rd World Conference on Photovoltaic Energy Conversion, Osaka, Japan, 2003.
Terao et al., "Recent Developments on the Flat-Plate Micro-Concentrator Module," Proceedings of the 29th IEEE Photovoltaic Specialists Conference, New Orleans, 2002.

* cited by examiner

*Primary Examiner*—Alex Noguerola
*Assistant Examiner*—Anthony Fick
(74) *Attorney, Agent, or Firm*—Okamoto & Benedicto LLP

(57) ABSTRACT

A reflector array comprises a plurality of partial parabolic reflectors arranged in rows and columns with each reflector directing radiation to a receiver or from a transmitter located at the focus of the reflector. In a compact photovoltaic cell arrangement, each cell is shielded from direct radiation by the adjacent reflector. The reflectors can be formed as one unit with reflective material or with the reflecting surfaces coated with aluminum, silver, or other suitable reflecting material. A secondary reflector can be positioned at the focus of a reflector for directing radiation to a receiver or from a transmitter located at a more accessible location in the array.

19 Claims, 5 Drawing Sheets

COMPACT MICRO-CONCENTRATOR FOR PHOTOVOLTAIC CELLS

STATEMENT REGARDING FEDERALLY SPONSORED RESEARCH OR DEVELOPMENT

This invention was made with U.S. Government support under DOE Sub contract No. AAT-1-30620-04. The U.S. Government has certain rights in the invention.

BACKGROUND OF THE INVENTION

This invention relates generally to photovoltaic or solar cell arrays, and more particularly, the invention relates to energy concentration for use in such arrays.

The use of photovoltaic cells for the direct conversion of solar radiation into electrical energy is well known, see Swanson, U.S. Pat. No. 4,234,352 for example. Briefly, the photovoltaic cell comprises a substrate of semiconductive material having a p-n junction defined therein. In the planar silicon cell the p-n junction is formed near a surface of the substrate which receives impinging radiation. Radiated photons create mobile carriers (holes and electrons) and the substrate which can be directed to an electrical circuit outside of the cell.

In practical applications, photovoltaic cells are arranged in modules with the cells being serially connected to increase output voltage and with a plurality of serially connected cells connected in parallel to increase output current. Efficiency of the arrays can be enhanced by using an energy concentrator with each cell, and the cost of high-efficiency solar cells can be reduced through use of less costly optics.

The parabolic reflector is a known structure for use in concentrating energy. As shown in FIG. 1A, a linear parabolic reflector or trough concentrates energy along a linear axis, and is useful for heating fluids in a pipe, for example, and in low concentration photovoltaic systems. In FIG. 1B, a dish-shaped parabolic reflector concentrates energy at a focal point and is useful for concentrating sound and radio waves. While useful in concentrating solar energy, heretofore the use of the parabolic reflector in a cell array panel requires too much space for practical application.

SUMMARY OF THE INVENTION

In accordance with the invention, a reflector array comprises a plurality of partial parabolic or similarly shaped surfaces arranged in rows and columns with each reflector directing radiant energy to or from a corresponding element at or near the focus of the reflector.

In accordance with a preferred embodiment of the invention, an array of photovoltaic cells is provided with each cell having a light reflector which focuses received light on the cell. The design is compact, scalable to large area modules, and easy to manufacture with the reflectors being molded as a single unit using a wide choice of material. The array achieves high efficiency with an absence of chromatic aberration.

In accordance with a preferred embodiment of the invention, an off-axis section of a parabolic reflector is used with each cell in a panel array of photovoltaic cells. The parabolic sections can be linearly arranged with each section reflecting light to a cell positioned under an adjacent section whereby a compact array is provided. Thus the receiver cell can be hidden from direct sunlight by the next parabolic section, with the parabolic sections being closely packed in a two-dimensional array.

Advantageously, the reflector array can be pressure formed or molded (herein referred to collectively as "formed") as a single piece of plastic or other suitable material with alignment features provided for the photovoltaic receivers. The reflecting surfaces of the array are coated with aluminum, silver, or other suitable reflective material, or the array can comprise a reflective material. Further, the reflector can be chosen to satisfy certain spectral properties, such as being transparent to infrared light to reduce heating.

In accordance with another embodiment, a secondary optical element, either reflective or refractive, can be provided with each cell receiver to further concentrate reflected radiation. The whole optical design can be optimized either using known imaging optical design techniques or a prior art simultaneous multiple surface (SMS) design technique for non-imaging optics to further concentrate reflected radiation, homogenize light distribution on the receiver, or increase the acceptance angle of the system. Further, the array of reflectors can be employed in other applications and can be used to distribute light emitted by a source at the receiver location in lieu of the photovoltaic receiver cell.

The invention and objects and features thereof will be more readily apparent from the following detailed description and appended claims, when taken with the drawings.

DETAILED DESCRIPTION OF ILLUSTRATIVE EMBODIMENTS

Figure 1A:
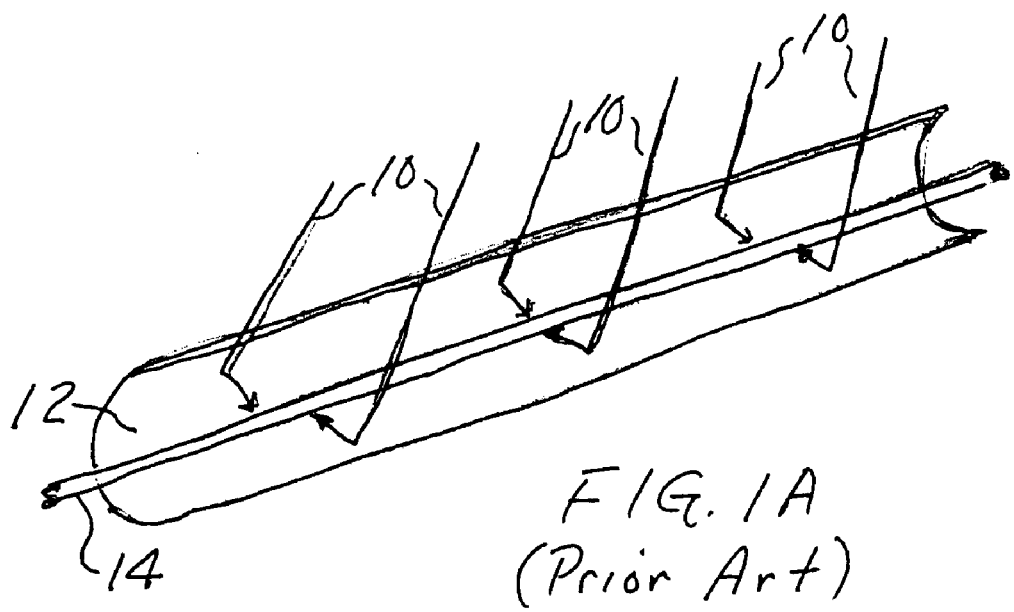
FIG. 1A is a perspective view of a linear parabolic reflector or trough in accordance with the prior art.
Figure 1B:
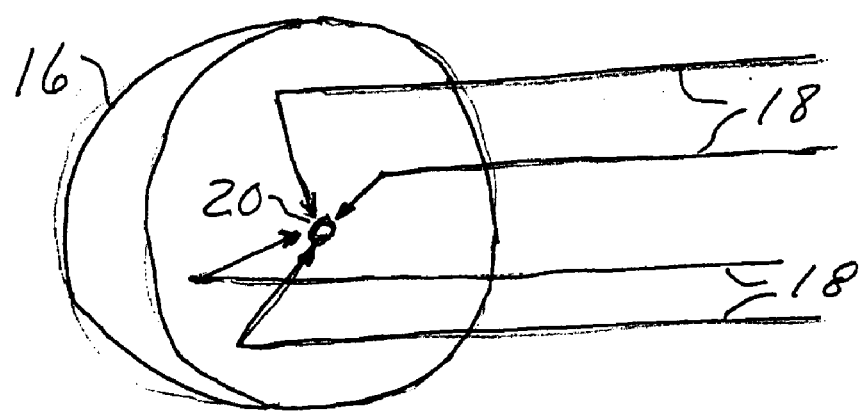
FIG. 1B is a perspective view of a parabolic dish reflector in accordance with the prior art.

The parabolic reflector is a well-known device for receiving and directing energy to a central point, line or region, termed the "focus," and similarly for transmitting energy radiating from the focus to the reflector and then transmitted outwardly in a beam that is parallel to the axis of the reflector. FIG. 1A is a perspective view of a prior art linear parabolic reflector in which energy such as radiant energy 10 striking the reflector 12 is directed to a line focus 14, for use in low concentration photovoltaic systems. Similarly, the parabolic dish 16 of FIG. 1B receives radiant energy and transmits the energy to a central point, or focus 20. Alternatively, energy radiating from the focus 20 to dish 16 can be transmitted outwardly in a beam 18 that is parallel to the axis of the dish.

Figure 2:
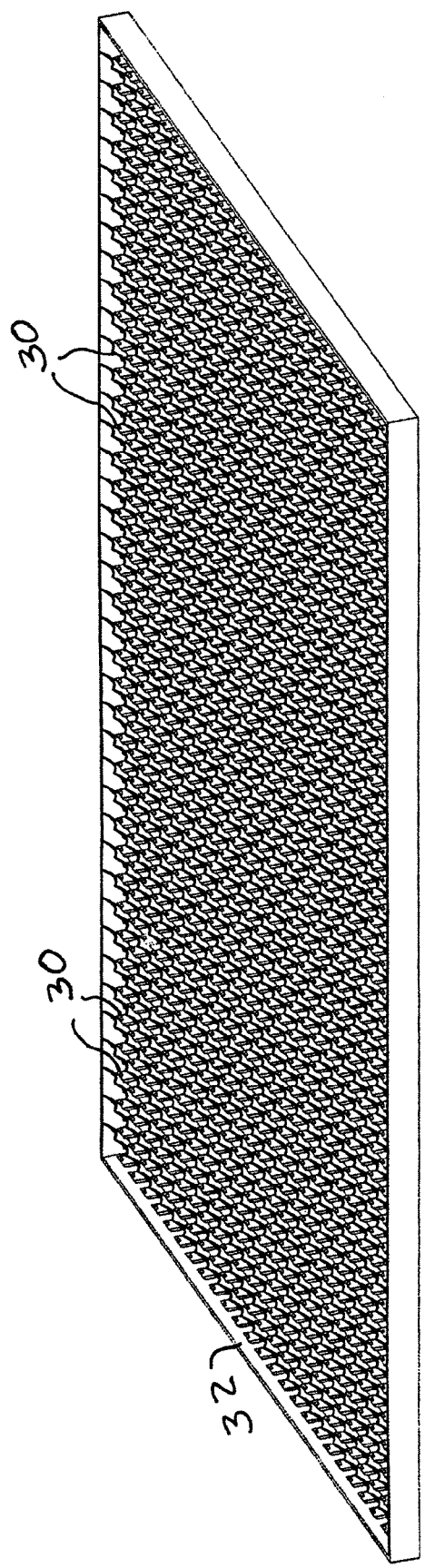
FIG. 2 is a perspective view of a photovoltaic panel in accordance with an embodiment of the invention.

In accordance with the present invention, a compact micro-concentrator for photovoltaic cells, for example, is provided in which a plurality of radiation reflectors, each comprising an asymmetric section of a parabolic or similarly shaped surface, are arranged in rows and columns such as illustrated by the reflectors 30 in the module 32 illustrated in the perspective view of FIG. 2. In some embodiments of the invention, the parabolic surface can have some deviations to obtain a particular light distribution for a finite size source or emitter and for different ray directions. In this embodiment, 25 rows and 40 columns of reflectors are provided with a total of 1000 individual reflectors. Associated with each reflector is a photovoltaic cell. In the compact arrangement 32 illustrated in FIG. 2, except for the last row of cells, each cell is shielded from direct radiation by an adjacent reflector 30 with the reflector corresponding to the photovoltaic cell directing radiation to the cell from the side.

Figure 3:
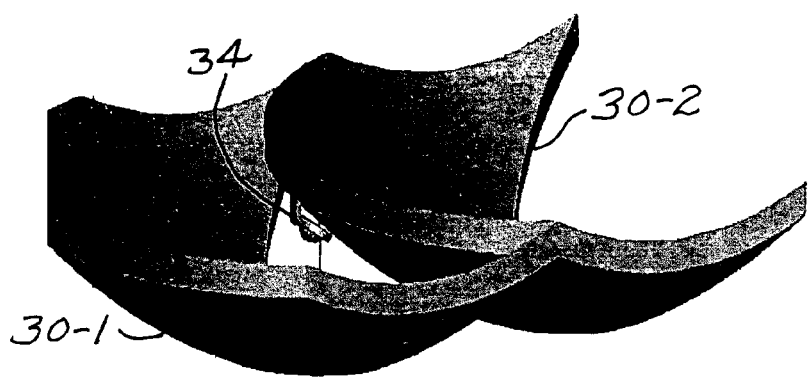
FIG. 3 is a perspective view of two adjacent reflectors and a receiver in the panel of FIG. 2.
Figure 4A:
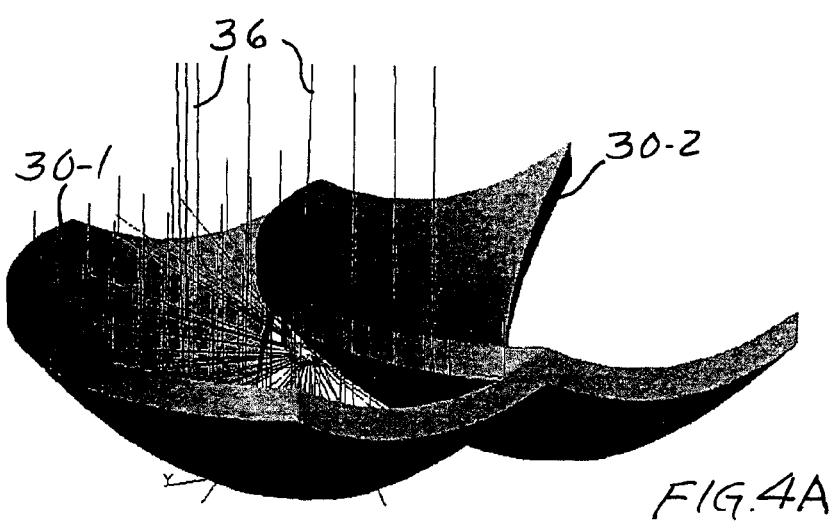
FIG. 4A and FIG. 4B are a perspective view and a view at 45°, respectively, illustrating the reflection of light with the reflector of FIG. 3.
Figure 4B:
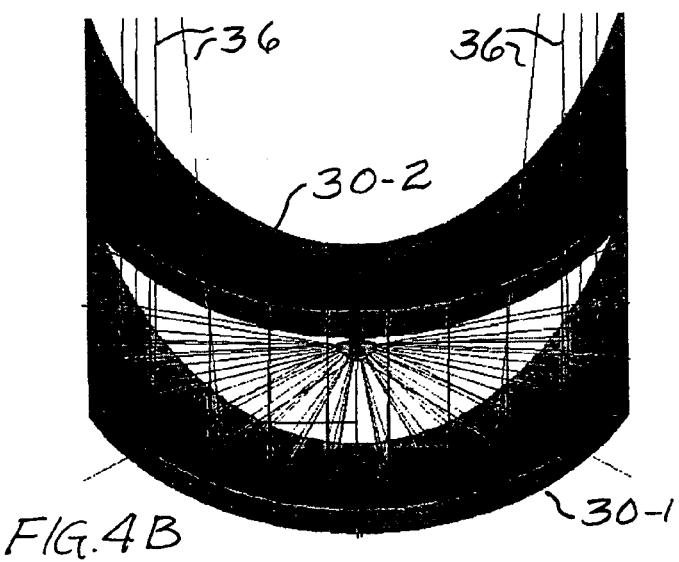

FIG. 3 is a perspective view of two adjacent parabolic reflectors 30-1 and 30-2 with a photovoltaic cell 34 corresponding to reflector 30-1 shown beneath adjacent reflector 30-2. FIG. 4A illustrates the reflection of radiation 36 by reflector 30-1 to photovoltaic cell 34, and FIG. 4B is a tilted end view also illustrating the reflection of radiation 36 by reflector 30-1 to cell 34. It will be appreciated that the arrangement provides for a compact array of photovoltaic cells in which each cell can be positioned beneath an adjacent reflector so that no direct radiation from the sun is lost by hitting inactive parts of the cell, such as the edges and back side. Only cells corresponding to the last row of reflectors will not be covered but could be hidden in the frame of the module. Advantageously, the parabolic reflectors can be formed by molding or pressure forming as a unitary structure of reflecting material or with the reflecting surfaces of the structure being coated with aluminum, silver, or other highly reflective material applied by sputtering or evaporation, for example.

Figure 5:
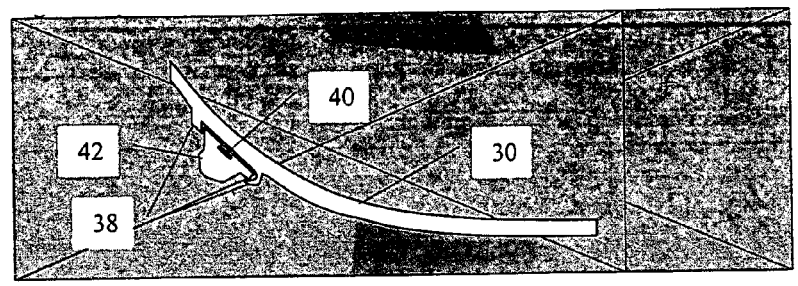
FIG. 5 is a cross-sectional view of a parabolic reflector with more complex shape including structures for mounting the photovoltaic cell receiver corresponding to an adjacent reflector.

Advantageously, the backside of each reflector 30 can include appendages 38 as shown in FIG. 5 on which is mounted the photovoltaic cell for the adjacent reflector. The slope of the backside can be optimized for maximum reception of rays from the reflector.

Figure 6:
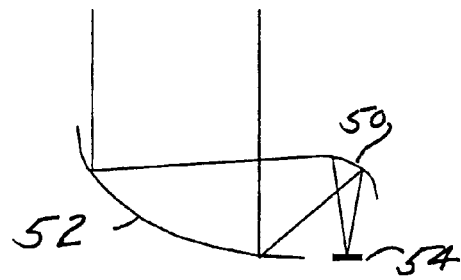
FIGS. 6, 7, and 8 illustrate the use of secondary mirrors in the reflector arrays.
Figure 7:
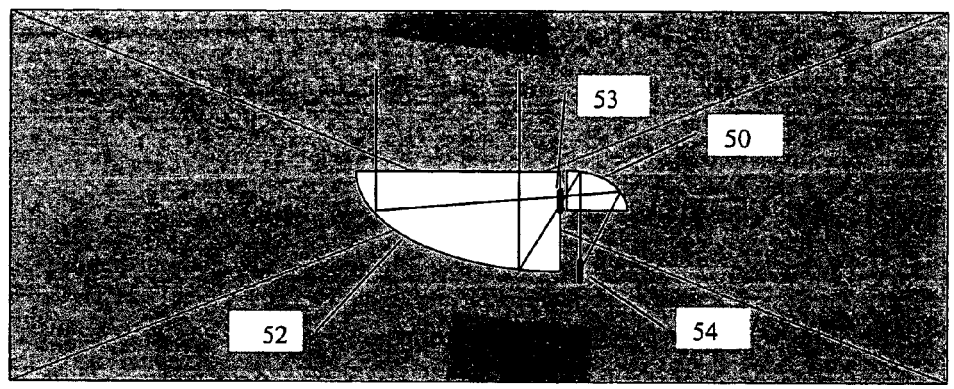

In an alternative embodiment shown in FIG. 6, a secondary mirror 50 can be placed near the focus of each parabolic mirror 52 and deflect light onto a photovoltaic receiver 54 placed at the bottom of the structure. This location for the cell offers the advantage of being more easily accessible for electrical and thermal contact. The secondary mirror can either be made as a part of the parabolic mirror or as part of the photovoltaic receiver. Alternatively, the secondary mirror 50 can be placed behind the first photovoltaic receiver 53 to concentrate light transmitted through the first receiver 53 onto a second receiver 54, as shown in FIG. 7.

Figure 8:
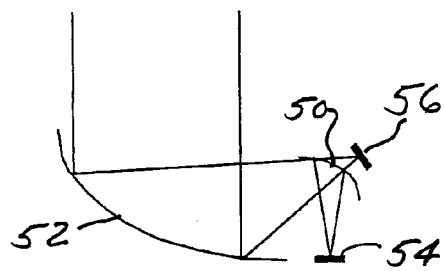

As shown in FIG. 8, a secondary mirror 50 can also be a dichroic mirror whereby part of the radiation is deflected to a cell 54 situated at the bottom of the structure, as in the embodiment of FIG. 6, and part of the radiation is transmitted to another cell 56 situated at the same location as in the main embodiment.

Figure 9:
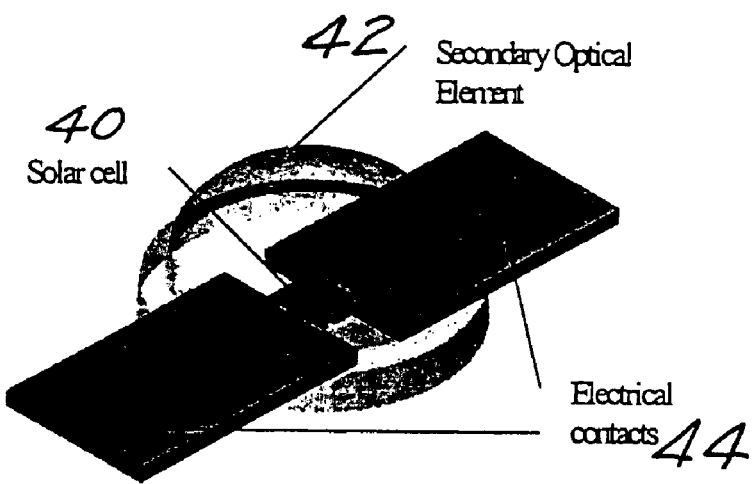
FIG. 9 illustrates a photovoltaic receiver with a refractive secondary optical element.

FIG. 9 illustrates an embodiment in which a photovoltaic cell 40 is placed within a convex lens 42 with electrical contacts 44 extending therefrom.

The space above the parabolic mirror in the module of FIG. 2 can be filled with a transparent material to reduce the number of refractive surfaces, i.e., Fresnel losses in the system. The transparent material can become part of the support for the reflective surface. However, in this embodiment, it would not be possible to mold a whole two-dimensional array of mirrors as a single piece. Rather, individual reflectors are molded independently and can include a solar cell and other secondary optical elements. A cover glass is not required but can be used to support and align each individual element. In embodiments where a transparent support material is not included, a cover glass is employed for protection.

Figure 10:
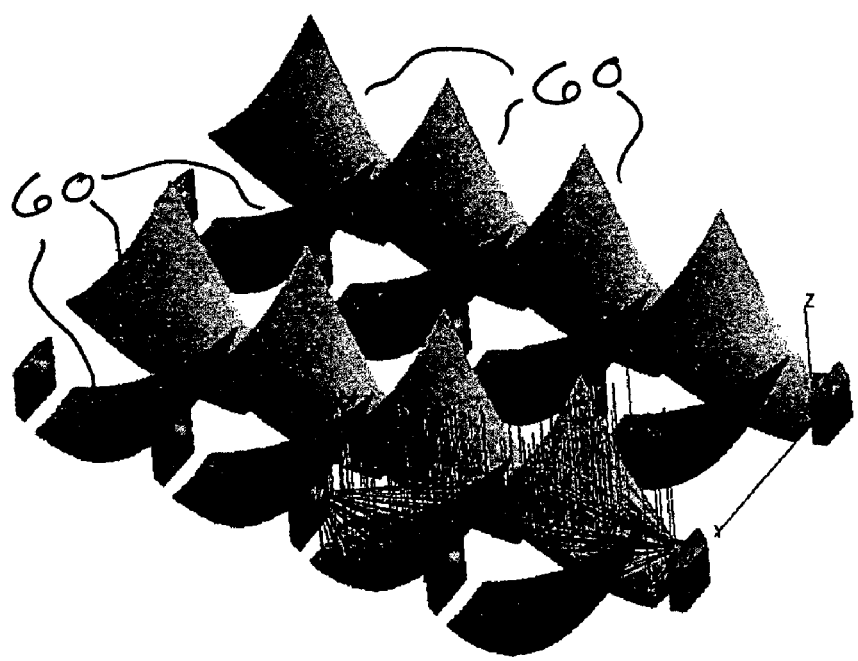
FIG. 10 illustrates an array including triangular parabolic sections.

The parabolic sections can have different shapes, including triangular, as illustrated in FIG. 10. Here the parabolic sections 60 are turned in alternating directions from row to row.

The reflector module in accordance with the invention has applications other than for a photovoltaic converter and can be used for the transmission of energy as well as the reception of energy, such as the transmission of light and sound energy.

Thus, while the invention has been described with reference to specific embodiments, the description is illustrative of the invention and is not to be construed as limiting the invention. As used herein and in the claims, "formed material" includes molded material and pressure formed material. Various modifications and applications may occur to those skilled in the art without departing from the true spirit and scope of the invention as defined by the appended claims.

What is claimed is:

1. A compact photovoltaic module comprising:
    a) a plurality of radiation reflectors each comprising an asymmetric portion of a parabolic or similarly shaped surface having a vertically and a longitudinally curved configuration, the plurality of radiation reflectors being serially arranged, and
    b) a plurality of photovoltaic cells with each cell having a corresponding reflector for directing radiation to the cell, each cell being shielded from direct radiation by an adjacent reflector and with the corresponding reflector directing off-axis radiation to the cell.

2. The compact photovoltaic module as defined by claim 1 wherein each reflector comprises a formed material with a reflective surface.

3. The compact photovoltaic module as defined by claim 2 wherein the formed material is reflective.

4. The compact photovoltaic module as defined by claim 2 wherein the formed material includes a reflective coating.

5. The compact photovoltaic module as defined by claim 4 wherein the reflective coasting comprise aluminum.

6. The compact photovoltaic module as defined by claim 4 wherein the reflective coating comprises silver.

7. The compact photovoltaic module as defined by claim 2 wherein all reflectors are formed as one unit.

8. The compact photovoltaic module as defined by claim 2 and further including a secondary reflector located at or near the focus of a radiation reflector for directing radiation to a corresponding cell.

9. The compact photovoltaic module as defined by claim 2 and further including an optical refractor with each cell.

10. The compact photovoltaic module as defined by claim 2 wherein each cell is located at or near the focus of its corresponding reflector.

11. A radiation reflector array comprising a plurality of radiation reflectors arranged in rows and columns, each radiation reflector comprising an asymmetric portion of a parabolic or similarly shaped surface arranged in a vertically and a longitudinally curved configuration enabling radiation to be directed to or from a focus hidden behind an adjacent reflector with the radiation being off-axis with respect to the parabolic reflector.

12. The radiation reflector array as defined by claim 11 wherein material comprising the reflector array is reflective.

13. The radiation reflector array as defined by claim 11 where each reflector comprises a formed material with a reflective coating on a surface.

14. The radiation reflector array as defined by claim 13 wherein the reflective coating comprises aluminum.

15. The radiation reflector array as defined by claim 13 wherein the reflective coating comprises silver.

16. The radiation reflector array as defined by claim 13 wherein all reflectors are formed as one unit.

17. The radiation reflector array as defined by claim 13 wherein each reflector transmits radiation to or from the focus of the radiation reflector.

18. The radiation reflector array as defined by claim 11 wherein a secondary reflector is located at the focus of the radiation reflector for directing radiation to and from the reflector.

19. The radiation reflector array as defined by claim 11 wherein each radiation reflector includes an appendage for the mounting of a receiver or transmitter.

* * * * *